US009159585B2

(12) United States Patent  
Tanioka et al.

(10) Patent No.: US 9,159,585 B2  
(45) Date of Patent: Oct. 13, 2015

(54) METHOD OF MANUFACTURING SEMICONDUCTOR DEVICE

(71) Applicant: MITSUBISHI ELECTRIC CORPORATION, Tokyo (JP)

(72) Inventors: Toshikazu Tanioka, Tokyo (JP); Yoichiro Tarui, Tokyo (JP); Kazuo Kobayashi, Tokyo (JP); Hideaki Yuki, Tokyo (JP); Yosuke Setoguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/071,406

(22) Filed: Nov. 4, 2013

(65) Prior Publication Data

US 2014/0242815 A1  Aug. 28, 2014

(30) Foreign Application Priority Data

Feb. 26, 2013  (JP) .................................. 2013-035300

(51) Int. Cl.
*H01L 21/04* (2006.01)
*H01L 21/324* (2006.01)
(Continued)

(52) U.S. Cl.
CPC ............ *H01L 21/324* (2013.01); *H01L 21/046* (2013.01); *H01L 21/67276* (2013.01); *H01L 29/1608* (2013.01); *H01L 29/66068* (2013.01); *H01L 29/7827* (2013.01)

(58) Field of Classification Search
CPC .............. H01L 21/045; H01L 21/1608; H01L 21/3165; H01L 21/32105; H01L 21/324; H01L 21/67248; H01L 21/67276; H01L 21/67288; H01L 2224/03011

USPC ......... 438/400, 404, 424, 425, 436, 438, 765, 438/767, 768

See application file for complete search history.

(56) References Cited

U.S. PATENT DOCUMENTS 7,667,301 B2  2/2010 Nakamura et al.  
2008/0299739 A1* 12/2008 Yoshizawa et al. ........... 438/424  
(Continued)

FOREIGN PATENT DOCUMENTS

JP  2009-117646 A  5/2009  
KR  2008-0106014 A  12/2008  
WO  2004/030073 A1  4/2004

OTHER PUBLICATIONS

An Office Action issued by the Korean Patent Office on Jul. 2, 2015, which corresponds to Korean Patent Application No. 10-2014-0015775 and is related to U.S. Appl. No. 14/071,406; with English language partial translation.

*Primary Examiner* — Thanhha Pham  
(74) *Attorney, Agent, or Firm* — Studebaker & Brackett PC

(57) ABSTRACT

A method of manufacturing a semiconductor device according to the present invention includes the steps of (b) forming, on a back face of a dummy substrate and back faces of a plurality of semiconductor substrates, inorganic films having such thicknesses as to be resistant to a temperature of a thermal oxidizing treatment or a heat treatment and to sufficiently decrease an amount of oxidation or reducing gaseous species to reach the back faces of the dummy substrate and the plurality of semiconductor substrates, (c) disposing the dummy substrate and the plurality of semiconductor substrates in a lamination with surfaces turned in the same direction at an interval from each other, and (d) carrying out a thermal oxidizing treatment or post annealing over the surfaces of the semiconductor substrates in an oxidation gas atmosphere or a reducing gas atmosphere after the steps (b) and (c).

4 Claims, 8 Drawing Sheets

(51) Int. Cl.
*H01L 21/321* (2006.01)
*H01L 21/16* (2006.01)
*H01L 21/67* (2006.01)
*H01L 29/66* (2006.01)
*H01L 29/78* (2006.01)
*H01L 29/16* (2006.01)

(56) References Cited

U.S. PATENT DOCUMENTS

2009/0186489 A1    7/2009  Nakamura et al.
2010/0148415 A1    6/2010  Nakamura et al.
2012/0252225 A1*  10/2012  Li et al. .................. 438/765

* cited by examiner

FIG. 7A
FIG. 7B
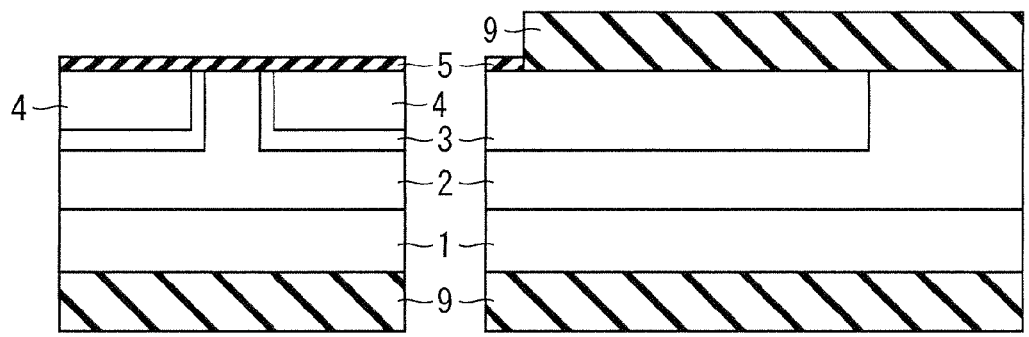
FIG. 8A
FIG. 8B
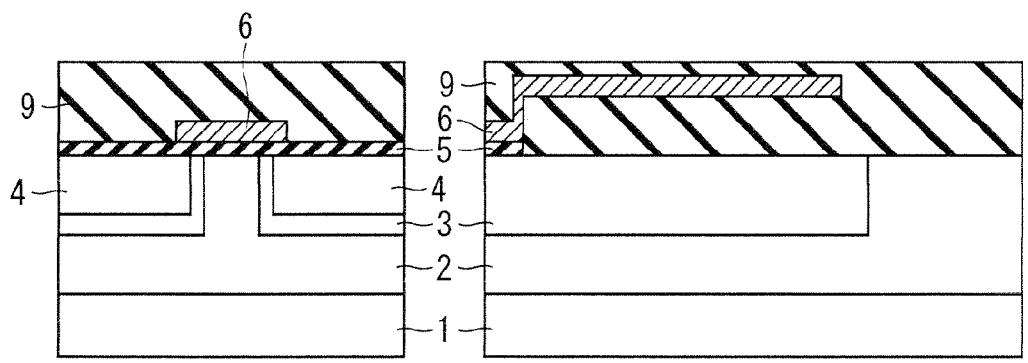
FIG. 9A
FIG. 9B
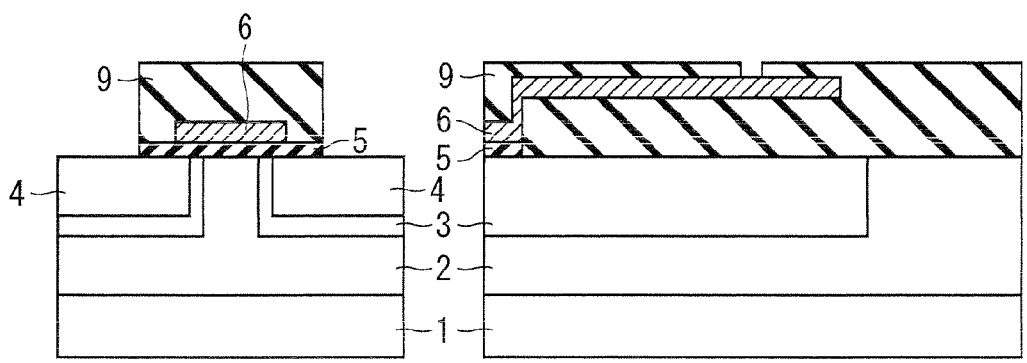

F I G. 1 0
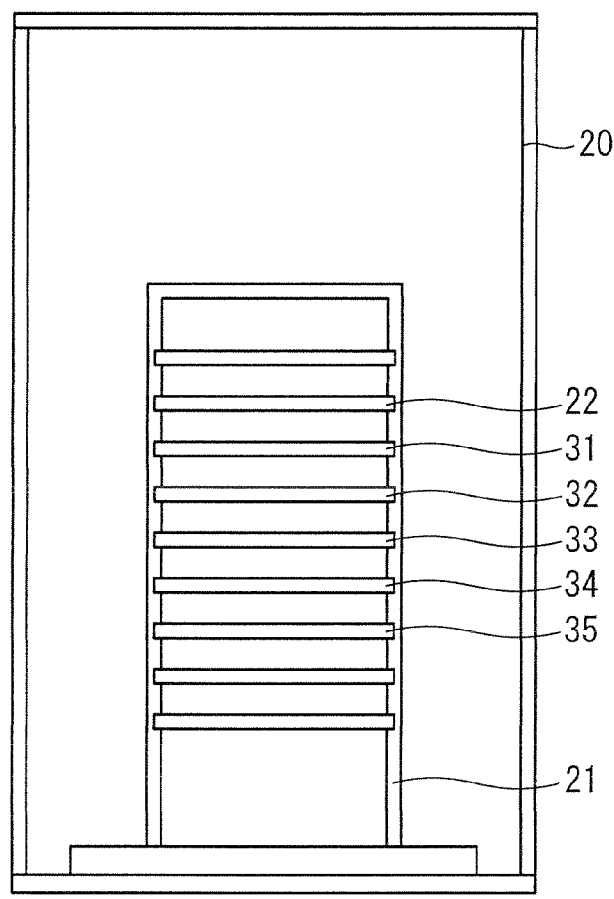

F I G. 1 3
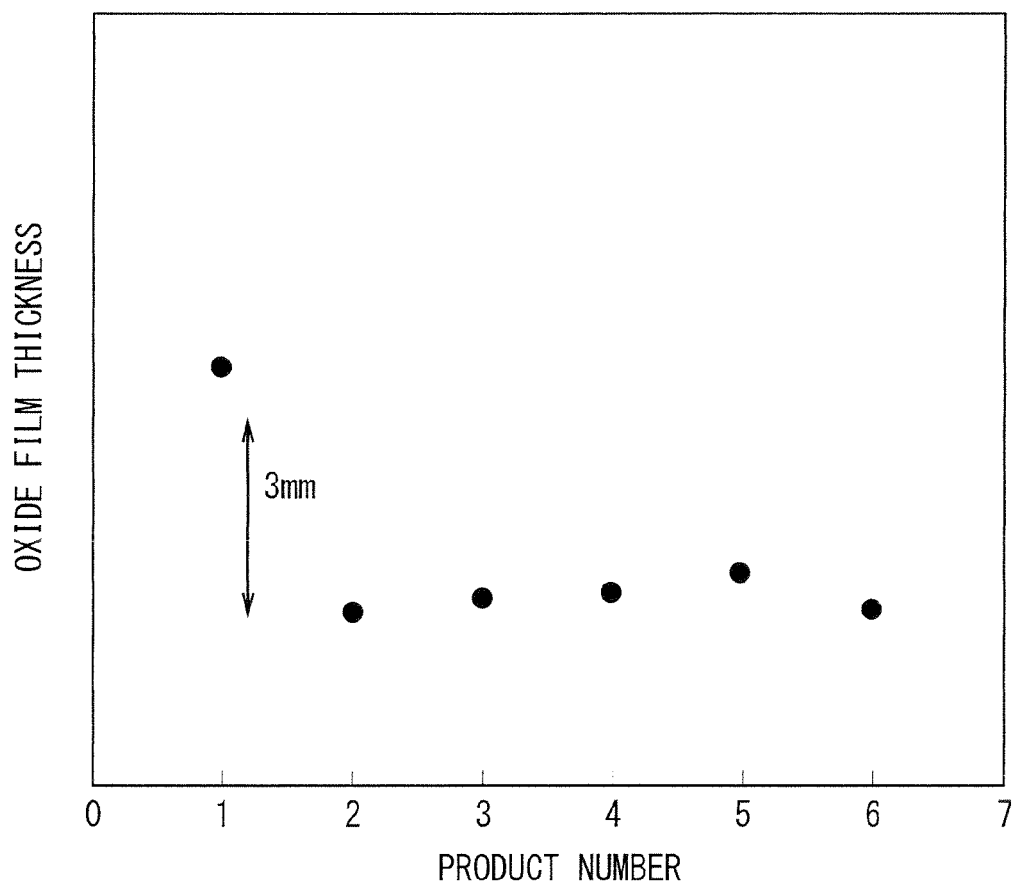

METHOD OF MANUFACTURING SEMICONDUCTOR DEVICE

BACKGROUND OF THE INVENTION

1. Field of the Invention

The present invention relates to a method of manufacturing a semiconductor device and more particularly to a process for heat treating a semiconductor substrate.

2. Description of the Background Art

In the case where a semiconductor substrate is heat treated by a batch type device, generally, a filling substrate (which will be hereinafter referred to as a dummy substrate) for eliminating a space of a slot to make a heat distribution uniform or a monitor substrate for managing a process is provided directly above upper ends of product substrates disposed in a vertical direction (see Japanese Patent Application Laid-Open No. 2009-117646). For example, a monitor substrate for confirming a thickness of a formed film is provided in a thermal oxidizing step or a CVD (Chemical Vapor Deposition) step in some cases. The same material as that of the product substrate may be used for the dummy substrate or the monitor substrate. In the case where the material of the product substrate is silicon carbide (which will be hereinafter referred to as SiC), however, it is general to use a more inexpensive substrate such as a silicon substrate (which will be hereinafter referred to as Si).

In the case where thermal oxidation for the product substrate having an inorganic film formed on a back face is carried out, a by-product is generated by a reaction to an atmospheric gas over the back face of the dummy substrate if an inorganic film is not formed on the back face. For this reason, there is a problem in that a difference is made in the atmospheric gas to which surfaces of the product substrate disposed directly under the dummy substrate and the other substrates are exposed and different electrical characteristics are thus obtained.

SUMMARY OF THE INVENTION

It is an object of the present invention to prevent one of processing substrates close to a dummy substrate from having a different electrical characteristic from that of the other processing substrates in the case where the dummy substrate and the plurality of processing substrates are heat treated in a lamination state at an interval from each other by a batch type device.

A method of manufacturing a semiconductor device according to the present invention includes the steps (a), (b), (c) and (d). In the step (a), a dummy substrate and a plurality of semiconductor substrates are prepared. In the step (b), there is formed, on a back face of the dummy substrate and back faces of the semiconductor substrates, an inorganic film having such a thickness as to be resistant to a temperature of a thermal oxidizing treatment or a heat treatment and to sufficiently decrease an amount of oxidation or reducing gaseous species to reach the back faces of the dummy substrate and the plurality of semiconductor substrates. In the step (c), the dummy substrate and the plurality of semiconductor substrates are disposed in a lamination with surfaces turned in the same direction at an interval from each other. In the step (d), a thermal oxidizing treatment or post annealing is carried out over the surfaces of the semiconductor substrates in an oxidation gas atmosphere or a reducing gas atmosphere after the steps (b) and (c).

According to the method of manufacturing a semiconductor device in accordance with the present invention, the inorganic film is formed on the back face of each of the dummy substrate and the semiconductor substrates in the step (b). Consequently, an atmospheric gas in the heat treatment is not consumed over the back face of each of the substrates. Therefore, an amount of the consumption of the atmospheric gas over the surface of each of the substrates is made uniform so that an electrical characteristic is caused to be even.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3 to 9B are sectional views each illustrating a process for manufacturing a semiconductor device by the method of manufacturing a semiconductor device according to the present invention;

FIGS. 10 and 11 are views each illustrating a method of manufacturing a semiconductor device according to the technical premise;

FIG. 13 is a chart showing a thickness of an oxide film of the semiconductor device manufactured by the method of manufacturing a semiconductor device according to the technical premise.

DESCRIPTION OF THE PREFERRED EMBODIMENTS

A. First Embodiment

Figure 1:
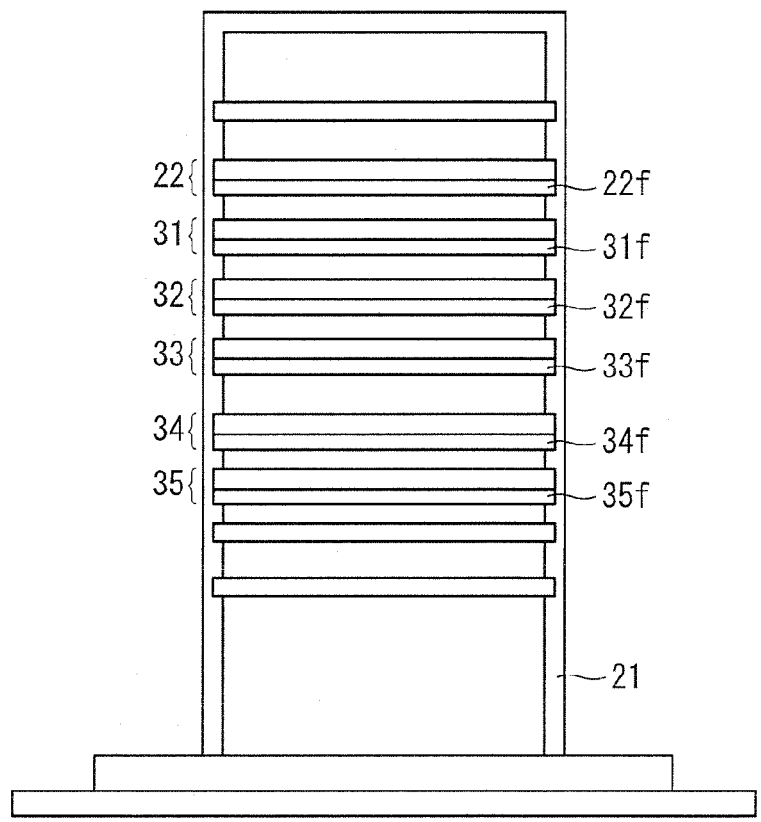
FIG. 1 is a view showing a method of manufacturing a semiconductor device according to the present invention.

FIG. 10 is a view showing a method of manufacturing a semiconductor device according to the technical premise, illustrating the arrangement of a semiconductor substrate in a heat treating step. In FIG. 10, product substrates 31 to 35 serving as semiconductor substrates for carrying out a heat treatment are provided in a lamination in a vertical direction with a gap formed each other in a boat 21 in a furnace 20. A dummy substrate 22 is provided with a gap formed over the product substrate 31 disposed in an uppermost stage. Herein, a monitor substrate may be provided in place of the dummy substrate 22 or the dummy substrate 22 may also be used as the monitor substrate.

Figure 11:
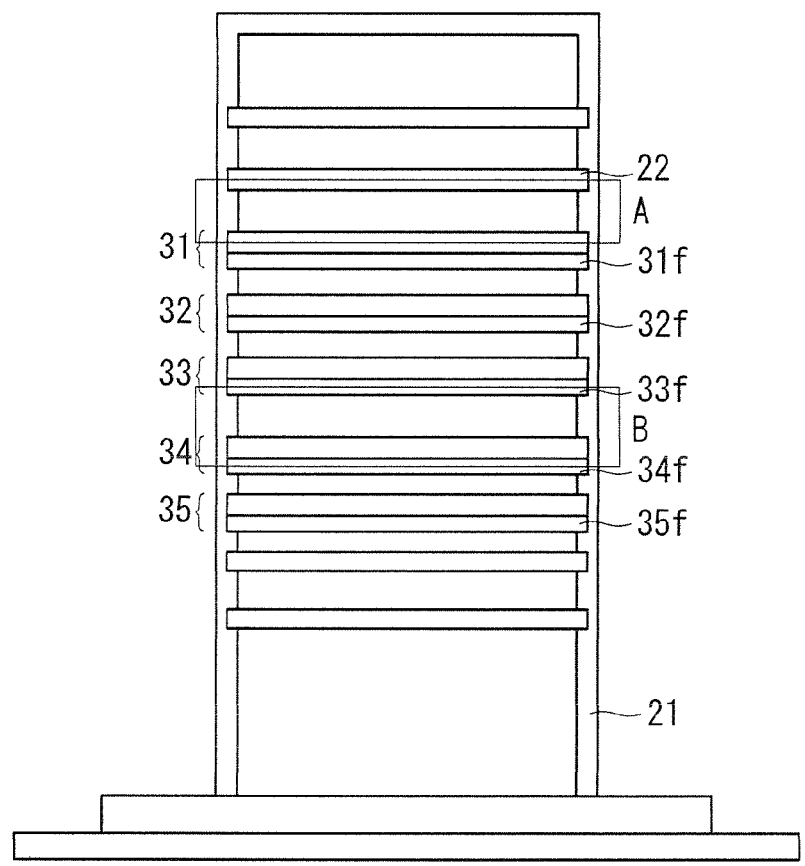

FIG. 11 is a view showing a method of manufacturing a semiconductor device according to the technical premise, illustrating the arrangement of the substrate in a step of post annealing a gate insulating film in an MOSFET as an example of a scene in which the product substrates 31 to 35 are heat treated in the arrangement of the substrate shown in FIG. 10. In FIG. 11, the furnace 20 shown in FIG. 10 is omitted. Herein, the product substrates 31 to 35 are set to be SiC substrates and the dummy substrate 22 is set to be an Si substrate. Oxide films 31f to 35f having a thickness of approximately 1 μm are formed on the back face side of the product substrates 31 to 35, while a film is not formed on the back face side of the dummy substrate 22 at all. Moreover, a gate insulating film (not shown) having a thickness of approximately 50 nm is formed on the surface side of the product substrates 31 to 35.

Figure 12:
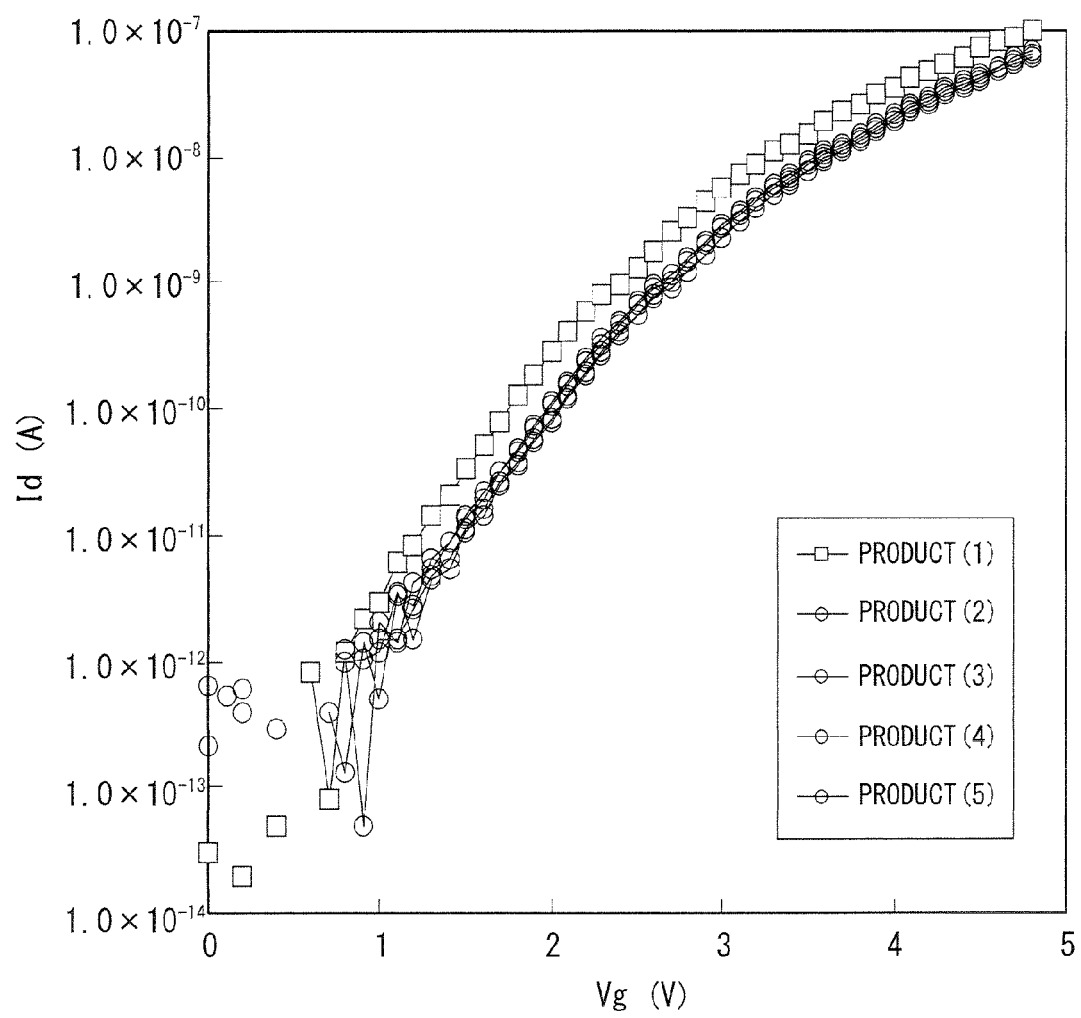
FIG. 12 is a chart showing an electrical characteristic of a semiconductor device manufactured by the method of manufacturing a semiconductor device according to the technical premise.

FIG. 12 is a chart showing an electrical characteristic of the semiconductor device manufactured by the method of manufacturing a semiconductor device according to the technical premise, illustrating a drain current Id-gate voltage Vg characteristic of an SiC-MOSFET (Metal Oxide Semiconductor Field Effect Transistor) formed via the step of post annealing a gate insulating film in the arrangement of the substrate shown in FIG. 11. Herein, it is assumed that the post annealing is carried out in a WET ($H_2/O_2$ mixture) atmosphere. The post annealing in the WET atmosphere is a process for raising a voltage (a threshold voltage) at which a drain current rises. The SiC-MOSFET formed by the product substrate 31 is indicated as a product (1), and the SiC-MOSFETs formed by the product substrates 32 to 35 are indicated as products (1) to (5) in the same manner.

It is apparent from FIG. 12 that a threshold voltage of the product (1) provided directly under the dummy substrate 22 is lower than threshold voltages of the products (2) to (5) and a distribution deviation of the electrical characteristic is generated in the product (1). The applicant considered the reason in the following way.

A WET atmospheric gas is consumed over the back face of the Si substrate (the dummy substrate 22) and the surface of the SiC substrate (the product substrate 31) in a region A of FIG. 11, while the WET atmospheric gas is consumed over the back face of the SiC substrate (the product substrate 33) and the surface of the SiC substrate (the product substrate 34) in a region B of FIG. 11. The WET atmospheric gas is consumed by thermal oxidation over the back face of the Si substrate (the dummy substrate 22) so that a reaction by-product is generated. On the other hand, since the thick oxide film 33f is formed on the back face side of the SiC substrate (the product substrate 33), it is possible to disregard the WET atmospheric gas which is thermally diffused to react to the SiC substrate. It was considered that the difference is caused by the distribution deviation of the product (1).

Therefore, it was supposed that the distribution deviation of the product (1) can be eliminated if the WET atmospheric gas is not consumed over the back face of the dummy substrate 22, and verification was thus carried out. In the present invention, as shown in FIG. 1, an inorganic film 22f ($SiO_2$) having a thickness of several μm was formed on the back face side of the dummy substrate 22. In addition, a heat treatment was carried out in the same substrate arrangement as that in FIG. 11. Consequently, the distribution deviation of the product (1) was eliminated.

Herein, there was considered the distribution deviation in the case where materials for the dummy substrate 22 and the product substrates 31 to 35 are different from each other. If the materials are different from each other, reaction rates or reaction by-products are different from each other. As compared with the case in which the same material is used, therefore, a difference between the atmospheric gases in the regions A and B of FIG. 11 is increased. Consequently, the effects of the present invention can be enhanced.

Also in the case where the dummy substrate 22 is formed by the same material as that of each of the product substrates 31 to 35, however, the same problem arises. In the case where a plane direction dependence of an oxidation rate is great, particularly, the distribution deviation is large so that the effects of the present invention are enhanced. In the case of 4H—SiC, for example, an oxidation rate of a (000-1) plane is higher than that of a (0001) plane by approximately ten times or more. In the case where the back face is set to be the (000-1) plane and a dummy substrate including a back surface having nothing formed thereon is used to heat treat a product having an insulating film in a thickness of several μm formed on a back face, a difference in the gas atmosphere between the regions A and B in FIG. 11 is increased. FIG. 13 shows a thickness of an oxide film formed by thermal oxidation in a 100% $O_2$ atmosphere in the same substrate arrangement as that in FIG. 11 except that the dummy substrate 22 is set to be the same SiC substrate as each of the product substrates 31 to 35 and a product substrate 36 (not shown) is added directly under the product substrate 35. In FIG. 13, in similarity to FIG. 12, the SiC-MOSFET formed by the product substrate 31 is indicated as the product (1) and the SiC-MOSFET formed by the product substrates 32 to 36 are indicated as the products (2) to (6) in the same manner.

It is apparent from FIG. 13, that the thickness of the oxide film in the product (1) provided directly under the dummy substrate 22 is greater than that of each of the products (2) to (6). This phenomenon can also be explained in the same model as the phenomenon in FIG. 12. In other words, a thermal oxidation reaction occurs over the back face of the SiC substrate (the dummy substrate 22), so that a CO or $CO_2$ reaction product is generated. Consequently, the gas atmosphere is changed, so that the oxidation rate is increased.

Based on the consideration described above, the SiC substrate having the oxide film formed in a thickness of several μm on the back face is used as the dummy substrate 22 in the present invention. Consequently, the distribution deviation of the product (1) can be eliminated.

Although there has been described the example in which the SiC substrate having the oxide film formed on the back face is heat treated with an oxidation type gas (a WET atmosphere, an $O_2$ atmosphere), the distribution deviation might be caused irrespective of a type of the substrate or presence of a film on the back face of the substrate if there is caused a situation in which gases to be consumed in the regions A and B shown in FIG. 11 or gases to be generated secondarily are different from each other.

Although there has been described the example in which the heat treatment is carried out with the oxidation based gas, moreover, the problem of the distribution deviation might arise also in the case where the heat treatment is carried out with a gas reacting to the substrate, for example, a reduction type gas or the like.

In the present invention, therefore, an inorganic film which reacts to the oxidation type gas, the reduction type gas or the like with difficulty and has a high temperature resistance is formed on the back face of the dummy substrate or the product. Consequently, it is possible to suppress the distribution deviation of a semiconductor device serving as the product.

<A-1. MOSFET>

Description will be given to an example in which a method of manufacturing a semiconductor device according to the present invention is applied to a gate insulating film forming step for the MOSFET. Although a semiconductor substrate serving as a product substrate is set to be an SiC substrate, it is also possible to use another substrate such as Si, GaN, GaAs or the like. Moreover, the material of the dummy substrate may be the same as or different from that of the semiconductor substrate. Furthermore, a device to be created may be another device such as a pn diode, an SBD (Schottky Barrier diode), a BJT (Bipolar Junction Transistor), a JFET (Junction FET) or an IGBT (Insulated Gate Bipolar Transistor) in addition to the MOSFET. Moreover, the present invention may be applied to another step of carrying out a heat treatment by a batch type device such as a step of heat treating a metal electrode in addition to the gate insulating film forming step.

Figure 2A:
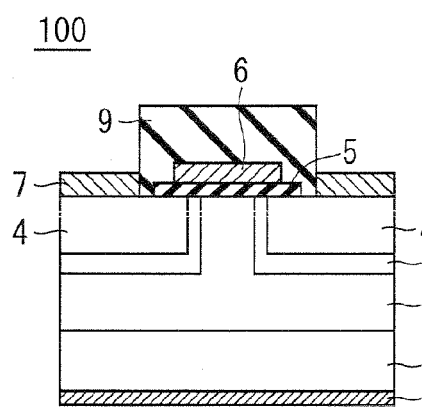
FIGS. 2A and 2B are sectional views each illustrating a semiconductor device manufactured by the method of manufacturing a semiconductor device according to the present invention.
Figure 2B:
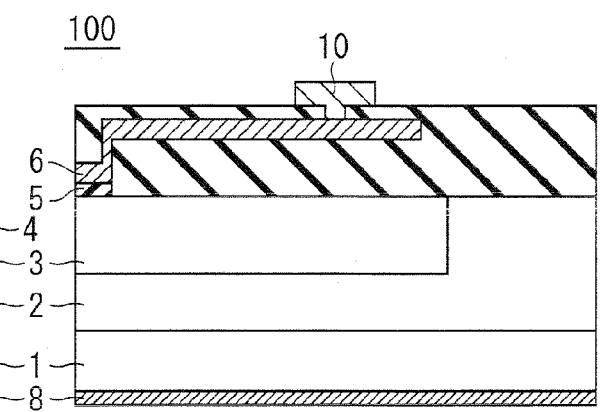

FIG. 2 is a typical sectional view showing a vertical type MOSFET 100 manufactured by the method of manufacturing a semiconductor device according to the present invention. The MOSFET 100 is a silicon carbide semiconductor device manufactured by the product substrates 31 to 35 shown in FIG. 1. FIG. 2A shows an inner portion of a cell and FIG. 2B shows an outer peripheral portion of the cell. Although description will be given on the assumption that a first conductivity type is set to be an n type and a second conductivity type is set to be a p type, the conductivity types may be reversed.

The MOSFET 100 includes an SiC substrate 1, an SiC drift layer 2, a base region 3, a source region 4, a gate insulating film 5, a gate wiring 6, a source electrode 7, a drain electrode 8, an interlayer insulating film 9, and a gate electrode 10. The SiC substrate 1 has a plane direction of a first main surface (a surface) which is a (0001) plane, is of an n type having a 4H polytype and has a low resistance. The SiC drift layer 2 is formed on the first surface of the SiC substrate 1. The base region 3 is selectively formed on a surface layer of the SiC drift layer 2 and contains aluminum (Al) as a p-type impurity. The source region 4 is selectively formed on the surface layer of the base region 3 in the inner portion of the cell and contains nitrogen (N) as an n-type impurity.

The gate insulating film 5 is formed over the source region 4, the base region 3 and the SiC drift layer 2 interposed between two source regions 4 which are close to each other. The gate wiring 6 is formed on the gate insulating film 5. The source electrode 7 is formed on a surface of the source region 4 on which the gate insulating film 5 is not formed. Moreover, the drain electrode 8 is formed on a second main surface at an opposite side to the first main surface of the SiC substrate 1, that is, a back face. The gate wiring 6 and the source electrode 7 are isolated from each other through the interlayer insulating film 9. The gate wiring 6 is provided from the inner portion of the cell to the outer periphery of the cell and forms a contact with the gate electrode 10 on the outer periphery of the cell.

<A-2. Manufacturing Process>

FIGS. 3 to 9B are sectional views showing a process for manufacturing the MOSFET 100. The process for manufacturing the MOSFET 100 will be described below with reference to FIGS. 3 to 9B.

Figure 3:
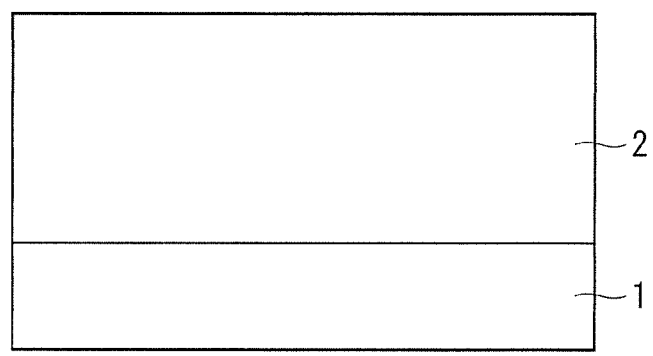

First of all, the SiC drift layer 2 is subjected to epitaxial growth on the first main surface (the surface) of the SiC substrate 1 by a CVD method (FIG. 3). An n-type impurity concentration of the SiC drift layer 2 is set to be $1\times10^{15}$ cm$^{-3}$ to $1\times10^{17}$ cm$^{-3}$ and a thickness is set to be 5 to 50 μm.

Figure 4:
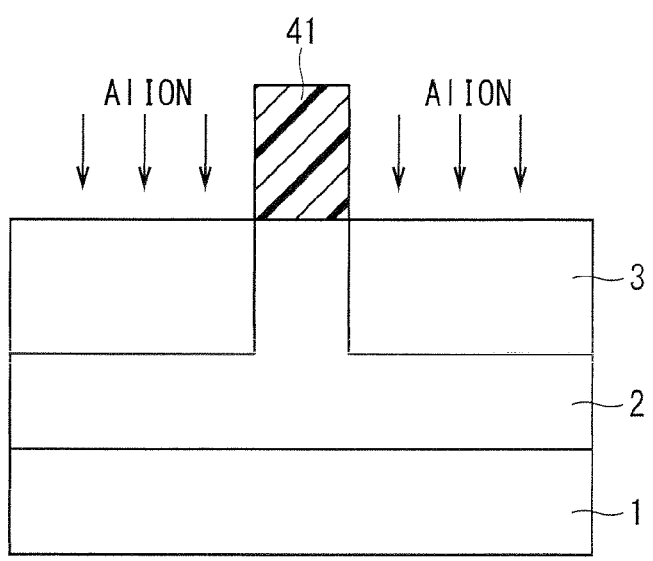

Next, a mask 41 is formed on a surface of the SiC drift layer 2 and is used to implant an ion of Al to be a p-type impurity into the SiC drift layer 2 (FIG. 4). At this time, an implantation depth of the Al ion is set to be approximately 0.5 to 3 μm which does not exceed a thickness of the SiC drift layer 2. Moreover, it is assumed that an impurity concentration of the Al ion thus implanted ranges from $1\times10^{17}$ cm$^{-3}$ to $1\times10^{19}$ cm$^{-3}$ and is higher than the n-type impurity concentration of the SiC drift layer 2. Herein, any of regions in the SiC drift layer 2 which has a p type and is subjected to the Al ion implantation serves as the base region 3.

Figure 5:
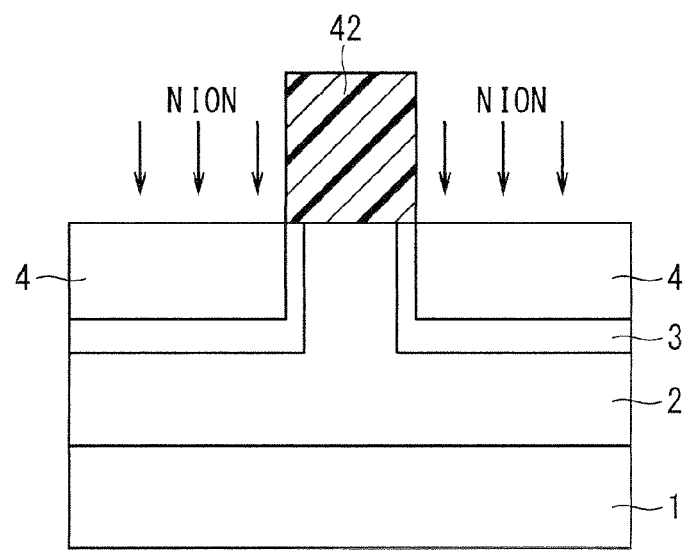

After the mask 41 is removed, subsequently, a mask 42 is formed on the surface of the SiC drift layer 2 and is used to implant an ion of N serving as an n-type impurity onto the surface of the SiC drift layer 2 (FIG. 5). An implantation depth of the N ion is set to be smaller than a thickness of the base region 3. Moreover, it is assumed that an impurity concentration of the N ion thus implanted ranges from $1\times10^{18}$ cm$^{-3}$ to $1\times10^{21}$ cm$^{-3}$ and exceeds a p-type impurity concentration of the base region 3. Any of regions in the SiC drift layer 2 into which N is implanted and which is of an n-type serves as the source region 4. After the mask 42 is removed, annealing is carried out for 30 seconds to one hour at 1300 to 1900° C. in an inert gas atmosphere such as an argon (Ar) gas by a heat treating device so that the implanted N and Al ions are activated.

Figure 6A:
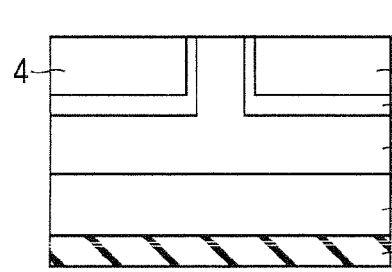
Figure 6B:
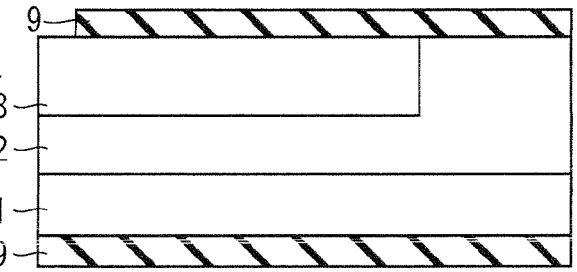

Next, the interlayer insulating film 9 is formed by the CVD method (FIGS. 6A and 6B). The interlayer insulating film 9 serves to provide the gate wiring 6 to be formed in a subsequent step around an outer peripheral portion of a chip, thereby taking a contact with a gate electrode. It is desirable that the film thickness should be set to be 1 to 3 μm in which a gate capacitance is not influenced and breakdown occurs with difficulty by switching, a surge or the like. BPSG, PSG, TEOS or the like is used as the material of the interlayer insulating film 9. The interlayer insulating film 9 is formed on the surface and back face sides of the SiC substrate 1. After the film formation, the interlayer insulating film 9 on the surface side is removed in the inner portion of the cell by patterning and dry etching, and the interlayer insulating film 9 in a desirable position on the surface side is removed also in the outer peripheral portion of the cell. On the other hand, the interlayer insulating film 9 formed on the back face side of the SiC substrate 1 is left and is used as an inorganic film having low reactivity to an oxidation (reducing) gas, that is, a high temperature resistance, so that a step of separately forming the inorganic film is not required. Herein, the low reactivity to the oxidation (reducing) gas implies that the film has such a thickness as to be resistant to a temperature of a thermal oxidizing treatment or a heat treatment and to sufficiently decrease an amount of oxidation or reducing gaseous species to reach the back face of the SiC substrate 1. An amount of the gas to be thermally diffused by the interlayer insulating film 9 having a thickness of 1 μm can be almost disregarded depending on a temperature of the heat treatment.

In the case where a device manufacturing process does not include the step of forming an interlayer insulating film, an inorganic film having low reactivity to the oxidation (reducing) gas and a high temperature resistance is separately formed on the back face of the SiC substrate 1. The inorganic film is formed by the CVD method, thermal oxidation or the like, and a metal oxide film, an insulating film such as PSG, or a nitride film (SiNx) is used as the material. In the case where the nitride film is used for the inorganic film, it is not necessary to newly form a nitride film if a gate structure of a device is SiO$_2$/SiNx/SiC, that is, the gate insulating film 5 has a two-layer structure including a nitride film and a silicon oxide film. The thickness of the inorganic film is determined in such a manner that the oxidation (reducing) gas rarely reaches the back face of the SiC substrate 1 even if the oxidation (reducing) gas is thermally diffused. Depending on the oxidation (reducing) gaseous species, it is sufficient that the thickness of the inorganic film is equal to or greater than 1 μm if the heat treatment is carried out at 1300° C. or less. After the inorganic film is formed on the surface and back face sides of the SiC substrate 1 on the condition described above, the inorganic film on the surface side is removed by wet etching or dry etching.

Next, the SiC substrate 1 is provided in the heat treating device as shown in FIG. 1. Herein, the SiC substrate 1 corresponds to the product substrates 31 to 35 in FIG. 1. The dummy substrate 22 having the inorganic film 22f with a high temperature resistance preformed on the back face side is provided on any of the SiC substrates 1 which is disposed in an uppermost stage. Then, thermal oxidation is carried out in an $O_2$ atmosphere at 1200 to 1300° C. to form an $SiO_2$ film to be the gate insulating film 5 (FIGS. 7A and 7B). The thermal oxidation is executed in an oxidation type gas atmosphere such as a WET atmosphere, an $O_2$ atmosphere or a nitrogen oxide (NO, $N_2O$) atmosphere. Subsequently, post annealing for reducing an interface level of $SiO_2/SiC$ is also executed in the substrate arrangement of FIG. 1 in the same manner. The post annealing is executed in an oxidation gas atmosphere such as the WET atmosphere, the nitrogen oxide (NO, $N_2O$) atmosphere or a $POCl_3$ atmosphere or a reducing gas atmosphere such as an $H_2$ gas atmosphere or an $NH_3$ gas atmosphere.

Then, a polycrystalline silicon film having an electrical conductivity is formed on the gate insulating film 5 by a low pressure CVD method and is subjected to patterning to form the gate wiring 6. Thereafter, the interlayer insulating film 9 having a thickness of approximately 1.0 to 3.0 μm is formed by a CVD device to cover the gate wiring 6. Subsequently, the interlayer insulating film 9 formed on the back face of the SiC substrate 1 and the polycrystalline silicon film are removed by the wet etching or the dry etching (FIGS. 8A and 8B). In the case where the device manufacturing process does not include the step of forming an interlayer insulating film and a separate inorganic film is formed, the inorganic film formed on the back face of the SiC substrate 1 is removed.

Next, the interlayer insulating film 9 in a region where the source electrode is to be formed is removed by the patterning and the dry etching. After a silicide layer is provided in the region where the source electrode is to be formed, moreover, the interlayer insulating film 9 in the region where a contact with the gate wiring 6 is to be taken is removed by the patterning and the dry etching (FIGS. 9A and 9B).

Then, the source electrode 7 and the gate electrode 10 to be electrically connected to the source region 4 and the gate wiring 6 are formed. These are formed by providing a film of an Al alloy or the like over the whole surface of the substrate through sputtering and then carrying out the patterning and the wet etching. Finally, the drain electrode 8 is formed on the back face side of the SiC substrate 1 so that the vertical type MOSFET 100 shown in FIG. 2 is finished. Herein, examples of the material of the drain electrode 8 include the Al alloy and the like.

<A-3. Variant>

Although the inorganic film 22f is preformed on the back face of the dummy substrate 22 in the execution of the heat treatment, the inorganic film does not need to be formed on the surface. Consequently, it is possible to monitor the film thickness or the like by using the surface of the dummy substrate 22. Thus, the dummy substrate 22 can also be used as a monitor substrate. In this case, it is not necessary to dispose a separate monitor substrate from the dummy substrate 22 in the same batch type device. Therefore, the number of processing sheets is increased, so that a productivity can be enhanced.

By using the dummy substrate 22 formed by quartz glass to be a material, it is not necessary to form the inorganic film on the back face because the quartz glass itself has low reactivity to the oxidation gas atmosphere or the reducing gas atmosphere. Differently from the case in which the inorganic film is formed, moreover, it is possible to carry out repetitive use.

<A-4. Effects>

The method of manufacturing a semiconductor device according to the present invention includes the steps of (a) preparing the dummy substrate 22 and the semiconductor substrates 31 to 35, (b) forming, on a back face of the dummy substrate 22 and back faces of the plurality of product substrates 31 to 35 (semiconductor substrates), inorganic films 22f and 31f to 35f having such thicknesses as to be resistant to a temperature of a thermal oxidizing treatment or a heat treatment and to sufficiently decrease an amount of oxidation or reducing gaseous species to reach the back faces of the plurality of semiconductor substrates, (c) disposing the dummy substrate 22 and the plurality of product substrates 31 to 35 in a lamination with surfaces turned in the same direction at an interval from each other, and (d) carrying out a thermal oxidizing treatment or post annealing over the surfaces of the semiconductor substrates 31 to 35 in an oxidation gas atmosphere or a reducing gas atmosphere after the steps (b) and (c). By the formation of the inorganic film on each of the back faces of the dummy substrate 22 and the product substrates 31 to 35, an atmospheric gas in the heat treatment is not consumed over the back faces of the respective substrates 22 and 31 to 35. Therefore, the amounts of the consumption of the atmospheric gas over the surfaces of the product substrates 31 to 35 are made uniform, so that an electrical characteristic is caused to be even.

Moreover, the step (b) serves to form, as the inorganic film, any insulating film such as a thermal oxide film, a CVD oxide film, a metal oxide film or PSG. Accordingly, it is possible to form an inorganic film such as an interlayer insulating film by utilizing the ordinary insulating film forming step in a semiconductor process. Alternatively, the step (b) serves to form a nitride film as the inorganic film. In the case where the gate insulating film 5 has a two-layer structure including a nitride film and a silicon oxide film, it is possible to form an inorganic film by utilizing the ordinary nitride film forming step in the semiconductor process.

In the case where the dummy substrate 22 is formed by a different material from that of each of the product substrates 31 to 35, furthermore, it is possible to obtain a great effect for reducing a distribution variation caused by the formation of the inorganic film on the back face of the dummy substrate 22. Even if the dummy substrate 22 is formed by the same material as that of each of the product substrates 21 to 35, it is possible to obtain the great effect for reducing the distribution variation caused by the formation of the inorganic film on the back face of the dummy substrate 22 in the case where a thermal oxidation rate differs between the surfaces and the back faces in the product substrates 31 to 35.

The step (a) serves to form the inorganic film 22f only on the back face of the dummy substrate 22. Therefore, it is possible to utilize the dummy substrate 22 as a substrate for monitoring a film thickness or the like for process management. Consequently, a separate monitor substrate is not required. Therefore, a productivity can be enhanced.

If the dummy substrate 22 formed by quartz glass is used, moreover, it is not necessary to form the inorganic film on the back face because the quartz glass itself has low reactivity to the oxidation gas atmosphere or the reducing gas atmosphere. Consequently, it is possible to carry out repetitive use.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:
   (a) preparing a dummy substrate and a plurality of semiconductor substrates;
   (b) forming, on a back face of said dummy substrate and back faces of said plurality of semiconductor substrates, an inorganic film having such a thickness as to be resistant to a temperature of a thermal oxidizing treatment or a heat treatment and to sufficiently decrease an amount of oxidation or reducing gaseous species to reach said back faces of said dummy substrate and said plurality of semiconductor substrates;

(c) disposing said dummy substrate and said plurality of semiconductor substrates in a lamination with surfaces of said inorganic film on said back faces of said dummy substrate and said plurality of semiconductor substrates facing a same direction at an interval from each other; and (d) carrying out a thermal oxidizing treatment or post annealing over said surfaces of said semiconductor substrates in an oxidation gas atmosphere or a reducing gas atmosphere after said steps (b) and (c), wherein said step (b) serves to form said inorganic film only on said back face of said dummy substrate.

2. The method of manufacturing a semiconductor device according to claim 1, wherein said step (b) serves to form, as said inorganic film, any insulating film such as a thermal oxide film, a CVD oxide film, a metal oxide film or PSG, or a nitride film.

3. The method of manufacturing a semiconductor device according to claim 1, wherein said dummy substrate is formed by a different material from that of each of said semiconductor substrates.

4. The method of manufacturing a semiconductor device according to claim 1, wherein said dummy substrate is formed by the same material as that of each of said semiconductor substrates, and a thermal oxidation rate differs between said surfaces and said back faces of said semiconductor substrates.

* * * * *